United States Patent
Tabe et al.

(10) Patent No.: US 9,351,425 B2
(45) Date of Patent: May 24, 2016

(54) CONTAINER-TYPE DATA CENTER

(71) Applicant: HITACHI SYSTEMS, LTD., Tokyo (JP)

(72) Inventors: Kenichi Tabe, Kanagawa (JP); Takeshi Kobayashi, Ibaraki (JP); Yutaka Asano, Tokyo (JP)

(73) Assignee: HITACHI SYSTEMS, LTD., Tokyo (JP)

( * ) Notice: Subject to any disclaimer, the term of this patent is extended or adjusted under 35 U.S.C. 154(b) by 0 days.

(21) Appl. No.: 14/782,128

(22) PCT Filed: Apr. 24, 2013

(86) PCT No.: PCT/JP2013/062042
§ 371 (c)(1),
(2) Date: Oct. 2, 2015

(87) PCT Pub. No.: WO2014/174606
PCT Pub. Date: Oct. 30, 2014

(65) Prior Publication Data
US 2016/0057893 A1    Feb. 25, 2016

(51) Int. Cl.
*H05K 7/20* (2006.01)
*H05K 7/14* (2006.01)
*F24F 1/60* (2011.01)

(52) U.S. Cl.
CPC .......... *H05K 7/20745* (2013.01); *H05K 7/1497* (2013.01); *F24F 1/60* (2013.01)

(58) Field of Classification Search
CPC ......... H05K 7/20; H05K 7/1497; H05K 5/02; H05K 7/18; G06F 1/20; F28F 13/00; F28F 27/00; F28D 15/00; F28D 17/04; F28D 3/122; F28D 31/00
USPC ............... 361/679.46–679.53, 690–696, 689, 361/698–702, 717, 800; 165/80.2–80.5, 165/104.14, 104.26, 121–126, 185; 454/184, 187, 228, 229, 230, 236, 237; 312/223.1, 223.2, 198, 257.1, 312/265.1–265.5, 236, 201; 220/1.5, 628, 220/635, 661, 421, 453, 455, 62.1, 62.22; 62/199, 259.2
See application file for complete search history.

(56) References Cited

U.S. PATENT DOCUMENTS 7,852,627 B2 * 12/2010 Schmitt ................ H05K 7/1497
361/694
8,310,829 B2 * 11/2012 Monk .................. F24F 11/0001
361/694

(Continued)

FOREIGN PATENT DOCUMENTS

JP          4-208331 A    7/1992
JP         10-114391 A    5/1998

(Continued)

OTHER PUBLICATIONS

International Search Report dated Jul. 23, 2013 for Application No. PCT/JP2013/062042.

(Continued)

*Primary Examiner* — Michail V Datskovskiy
(74) *Attorney, Agent, or Firm* — Ladas & Parry LLP

(57) ABSTRACT

A container-type data center is provided, which can be transported while having outdoor units of an air conditioning facility installed therein, and having an enhanced cooling effect. A partition panel 10 is provided for separating a container 100 into an IT equipment accommodation chamber 18 and an outdoor unit installation chamber 15, and on both ends of the panel are provided pillar sections 14e and 14f for the partition panel. The length-direction dimension of the outdoor unit installation chamber 15 is within the range of 1.6 to 2 meters, which can be selected arbitrarily according to the size of the outdoor units 6a through 6d. The outdoor units 6a through 6d are arranged so that their air discharge openings face the outer side in the width direction of the container. Regarding the outdoor units 6a through 6d, it is possible to set up an angle steel rack and stack two outdoor units vertically. According to this configuration, the container-type data center can be transported while having the outdoor units installed therein, and can exert sufficient cooling ability, which had been insufficient due to the small number of outdoor units installable in the prior art container-type data center.

4 Claims, 5 Drawing Sheets

(56) References Cited

U.S. PATENT DOCUMENTS

| | | | | |
|---|---|---|---|---|
| 8,456,841 B2* | 6/2013 | Peng | ................... | H05K 7/1497 361/694 |
| 8,457,536 B2* | 6/2013 | Nakamatsu | .......... | G03G 15/161 399/101 |
| 8,462,496 B2* | 6/2013 | Schmitt | ..................... | G06F 1/20 165/104.33 |
| 8,488,311 B2* | 7/2013 | Tsai | .................... | H05K 7/1497 165/104.33 |
| 8,755,184 B2* | 6/2014 | Peng | ................... | H05K 7/1497 361/679.46 |
| 2006/0082263 A1* | 4/2006 | Rimler | ..................... | B60P 3/14 312/201 |
| 2008/0060372 A1 | 3/2008 | Hillis et al. | | |
| 2013/0008197 A1* | 1/2013 | Lin | ..................... | H05K 7/1497 62/186 |

FOREIGN PATENT DOCUMENTS

| | | | | | |
|---|---|---|---|---|---|
| JP | 2012-252639 A | | 12/2002 | | |
| JP | 2012-53747 A | | 3/2012 | | |
| JP | 02012053747 A | * | 3/2012 | ................ | G06F 1/20 |
| JP | 2012-98799 A | | 5/2012 | | |
| JP | 2012098799 A | * | 5/2012 | ................ | G06F 1/20 |
| JP | 2012-256122 A | | 12/2012 | | |
| JP | 2013134032 A | * | 7/2013 | ................ | F24F 7/08 |

OTHER PUBLICATIONS

Notification of Reasons for Refusal dated Dec. 16, 2014 for Application No. JP 2014-543386.
J-PlatPat English abstract of JP 2012-252639 A.
J-PlatPat English abstract of JP 2012-53747 A.
J-PlatPat English abstract of JP 10-114391 A.
J-PlatPat English abstract of JP 2012-256122 A.
J-PlatPat English abstract of JP 4-208331 A.
J-PlatPat English abstract of JP 2012-98799 A.
https://www.hitachi-systems.com/solution/s006/fmitsm/cdc.html with partial English translation.

* cited by examiner

CONTAINER-TYPE DATA CENTER

RELATED APPLICATION

This application is an application under 35 U.S.C. 371 of International Application No. PCT/JP2013/062042 filed on Apr. 24, 2013, the entire contents of which are incorporated herein by reference.

TECHNICAL FIELD

The present invention relates to a container-type data center, and specifically, relates to a container-type data center capable of having the container transferred while having IT equipment and air conditioning facilities for cooling the container disposed within the container of the container-type data center.

BACKGROUND ART

A container-type data center has necessary facilities for constituting a data center stored in a container-type box used as a cargo transportation means using a trailer or the like, as taught in Non-Patent Literature 1. Actually, a container-type data center can store servers, storage apparatuses, control devices, air-conditioning facilities and power supply facilities, so that the container itself can be operated as a data center. It is possible to recognize the container-type data center as a new form of data center capable of being installed outdoors or being transported.

It has been recognized in Japan that the use of such container-type data centers are difficult due to the restrictions by the Building Standards Act, but on Mar. 25, 2011, a notice has been issued from the Ministry of Land, Infrastructure, Transport and Tourism on "Handling of the Building Standards Act regarding Container-type Data Center". According to the notice, "Regarding container-type data centers that can be disposed independently on land, those having only a main body of a server device and facilities required for realizing the functions of the data server installed therein, having minimum internal space required for realizing the functions of the data server such as the airway for air conditioning, and which are unattended during operation so that a person only enters the container when a serious failure occurs to the devices installed therein, are classified as a storehouse or other similar facilities defined in Article 2 item 3 of the Law. However, when multiple data centers are stacked, they are handled as a facility corresponding to a building architecture, instead of a storehouse or other similar facilities."

As for containers, the size of the external shape of the Container is prescribed based on ISO Standards, and in many cases, 40-feet-type containers are assigned as the container-type data centers. In the prior-art container-type data center, outdoor units of the air conditioning facility were disposed outside the container, so that it was necessary to arrange the container-type data center at a determined location, install outdoor units for air conditioning near the container, and then connect the air conditioning piping with indoor units of the data center.

Patent Literature 1(Japanese Patent Application Laid-Open Publication No. 2012-98799) is aimed at providing a unit type data center in an efficient form and a server room unit effectively and properly used as a structural element of the unit type data center. A server room unit includes multiple server racks and a cooling facility in a casing that can be installed adjacently to another casing, and functions by itself as a server room. In the casing, a cold area and a hot area are formed as sections, and the server racks are aligned at a boundary between the cold area and the hot area so that air can pass through the server racks. The cooling facility includes exhaust fans for supplying outside air to the cold area and discharging the air from the hot area to the outside, and air conditioners for conditioning cool air and circulating the cool air in the casing.

Patent Literature 2(Japanese Patent Application Laid-Open Publication No 2012-252639) aims at providing a building for accommodating electronic devices therein, which efficiently radiates inside heat to the outside while protecting the electronic devices by improving sealing performance, and which can be expanded and moved easily. Metal fasteners capable of being engaged with a tightener are fixed at upper and lower portions of columnar members disposed at four corners of a building, the building having a roof at a position lower than the metal fasteners and an intermediate ceiling board below the roof. Racks accommodating electronic devices are stored in a lower chamber under the intermediate ceiling board, wherein a heat exchanger and an air circulation fan for cooling air are disposed in the lower chamber, and an outdoor heat exchanger for radiating heat is disposed above the lower chamber, so that they sandwich the intermediate ceiling board. When the number of electronic devices increases, the building can be increased by directly disposing one building on another and engaging the metal fasteners with the tighteners. Heat generated by the electronic devices is radiated to the outside air through the heat exchanger in the lower chamber and the outside heat exchanger. The interior of the building is divided into a computer room CR storing computers such as servers and storages in the interior of the room, and a machine room MR having installed therein a power supply unit EU for supplying power to the computers and the like and a spare air conditioning outdoor unit CD and the like.

CITATION LIST

Patent Literature

[PTL 1] Japanese Patent Application Laid-Open Publication No. 2012-98799
[PTL 2] Japanese Patent Application Laid-Open Publication No. 2012-252639

Non-Patent Literature

[NPL 1] https://www.hitachi-systems,com/solution/s006/fmitsm/cdc.html

SUMMARY OF INVENTION

Technical Problem

However, in order to dispose the outdoor air conditioning unit for a container-type data center on the outer side of the container, only one or two outdoor air conditioning units can be disposed according to the configurations disclosed in the patent literatures, and when using a 40-feet-type container, for example, the number of air conditioning facilities is not sufficient with respect to the size of the inner space of the container, and there were cases where sufficient cooling ability could not be exerted.

The aim of the present invention is to dispose outdoor air conditioning units of a container-type data center to an inner side within the external, dimension of a container having a size corresponding to ISO standards, and increase the possible number of outdoor air conditioning units to be disposed, so as to improve the cooling ability of the container-type data center.

Solution to Problem

The present invention provides a container-type data center having an external shape corresponding to a size of a container for transportation, equipped with an air conditioning facility and loading multiple racks accommodating IT equipments in an interior thereof wherein the container has a framework composed of an upper frame and a lower frame having a substantially rectangular shape, and pillar sections connecting the four corners of the upper and lower frames, the upper frame having a ceiling surface formed of iron and the lower frame having a floor surface formed of iron disposed thereto; the container further comprises one pair of pillar sections for partition disposed between two respective pillar sections facing to each other in the longitudinal direction out of the four pillar sections, a partition panel in the width direction mounted between the pillar sections for partition; in one side of the container separated by the partition panel is formed an IT equipment accommodation chamber for accommodating components such as IT equipment by disposing side walls and an iron door to form a sealed space; and in the other side of the container is formed an outdoor unit installation chamber for arranging outdoor air conditioning units having an integrated ceiling surface and floor surface with the IT equipment accommodation chamber.

According further to the container-type data center of the present invention, the external dimension of the container is in Compliance with ISO standards, and the partition panel is disposed within a range of 1.6 to 2 meters from an end portion having the outdoor unit installation chamber of the container.

According further to the container-type data center of the present invention, one or two outdoor units for air conditioning are arranged so that an air discharge opening is faced toward a width direction of the container.

According even further to the container-type data center of the present invention, an angle steel rack is provided in the outdoor unit installation chamber, and the outdoor units for air conditioning are stacked vertically in upper and lower levels.

Advantageous Effects of Invention

According to the present invention, by placing the outdoor units for air conditioning at an inner side of an outer frame of the container, the outdoor units for air conditioning being mutually arranged back to back in the width direction of the container, and also by removing the side walls of the container where the outdoor units are arranged, it becomes possible to improve the cooling efficiency and to cut down the space of the container. Further, since work related to air conditioning at the destination location after transferring the container-type data center (such as the installation of outdoor units and arrangement of piping) becomes unnecessary, the time required to start operation of the data center can be reduced.

DESCRIPTION OF EMBODIMENTS

Now, the preferred embodiments for implementing the present invention will be described with reference to the drawings. Obviously, the present invention is easily applicable to configurations other than those illustrated in the present embodiment within the scope of the present invention. In the present specification, the longitudinal direction of a container is referred to as a "length direction", and a direction perpendicular thereto is referred to as a "width direction". Further, as for the terms "inner side" and "outside", the direction toward the inside of the container is referred to as "inside", and the direction toward the outer side thereof is referred to as "outside" or "outer side".

The present applicant has developed a container-type data center, as disclosed in non-patent literature 1. The disclosed data center has IT equipment such as a server and power supply/air conditioning facilities stored in a container, according to which the facilities required for a data center are gathered to provide a one-stop introduction and operation management. The size of its exterior is designed to facilitate transportation, so that transportation to various locations is enabled. The interior of the container adopts a layout to ensure sufficient maintenance space.

The container-type data center developed by the present applicant enables to realize automated operation by implementing a remote operation monitoring service. Further, the data center is designed to enable statuses of air-conditioning, power and power source to be confirmed, and to enable visual confirmation of the servers disposed within the container from a remote location using a monitoring camera. Therefore, it becomes possible to detect the occurrence of failure at an early stage, and to take measures for the failure. Further, the center is designed to detect abnormalities such as unauthorized invasion to the container, for example, through an outer monitoring operation using a monitoring camera, guarding of the circumference using laser, or entrance and exit control using biometric authentication.

Figure 1:
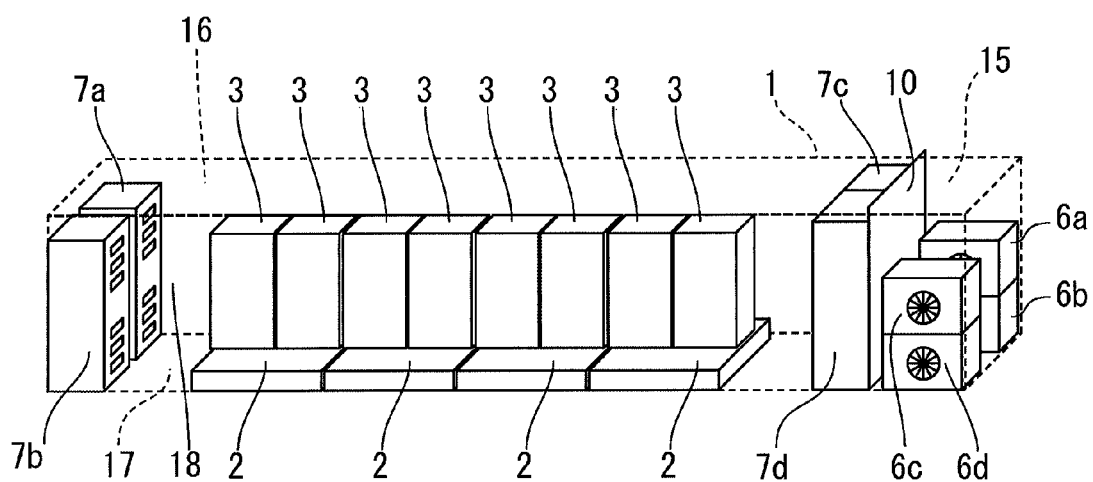
FIG. 1 is a perspective view illustrating an overall configuration of a container-type data center according to the present invention.
Figure 2:
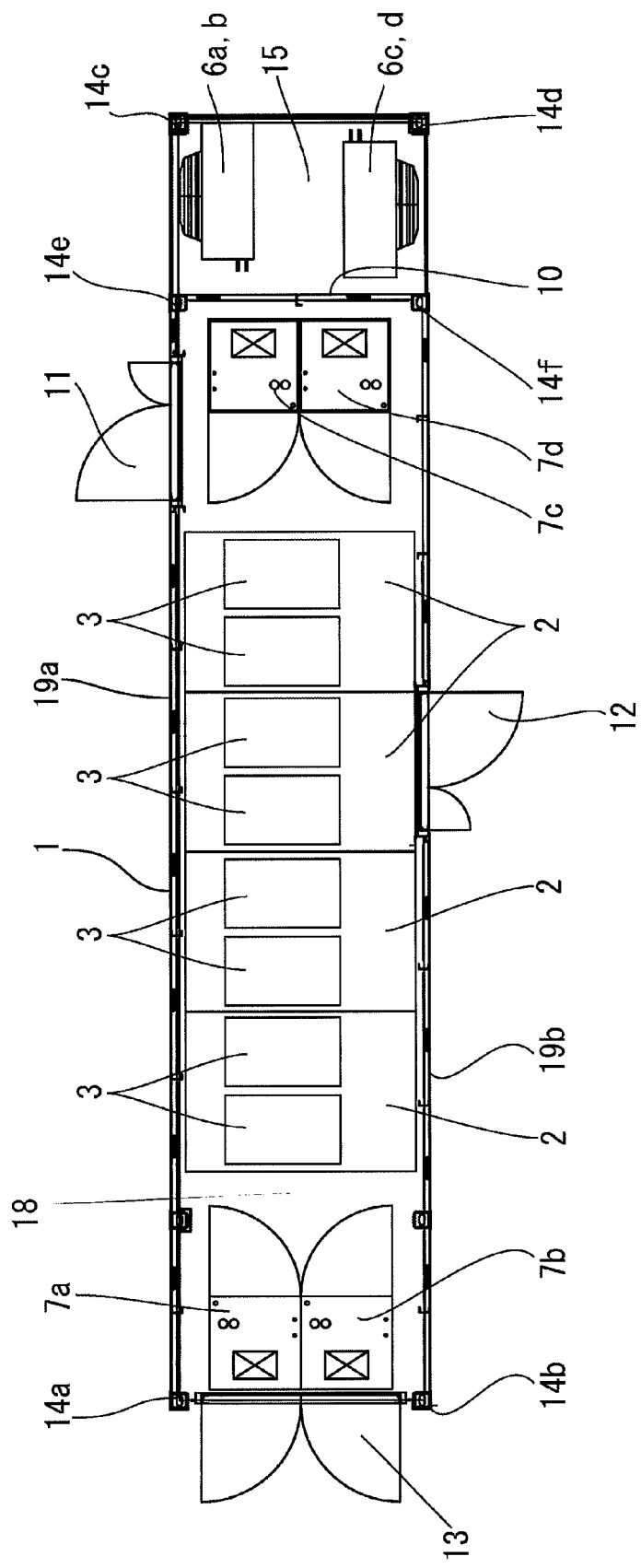
FIG. 2 is a plan view illustrating an overall configuration of the container-type data center according to the present invention.
Figure 3:
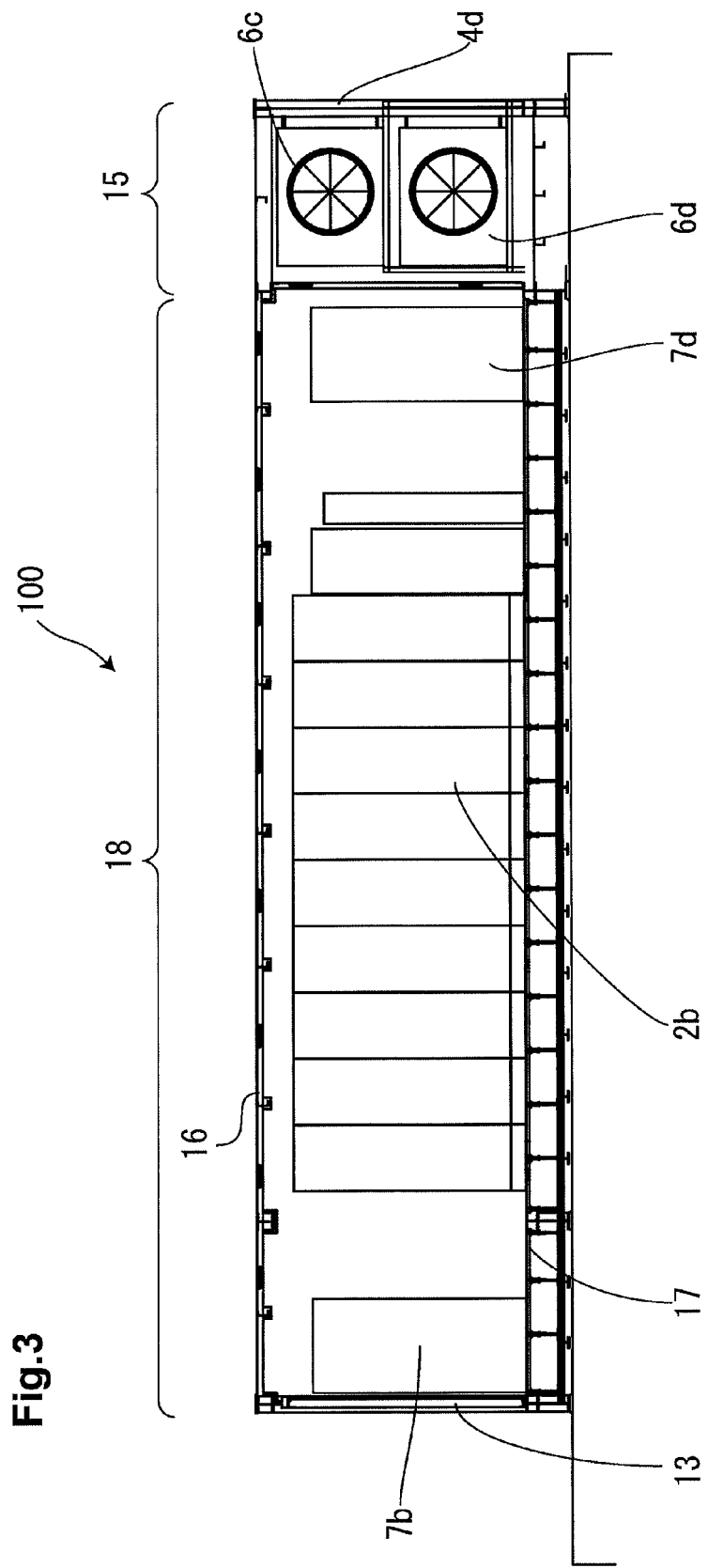
FIG. 3 is a side view illustrating an overall configuration of the container-type data center according to the present invention.

As shown in FIGS. 1 and 2, multiple vibration isolation table units 2 can be laid inside the container 1 of the container-type data center of the present invention. Multiple racks 3 for accommodating IT equipment and the like not shown are placed on a single vibration isolation table unit 2. In FIGS. 1 and 2, two racks 3 are placed on one vibration isolation table unit 2: The number of racks placed on one vibration isolation table unit can be determined based on the size of the vibration isolation table unit and the rack, the overall weight of the rack with the IT equipment loaded thereon, and the strength and number of spring vibration isolators. Of course, as shown in FIG. 3, it is possible to construct a unit of one-rack 3 having a vibration isolation function by placing a single rack 3 on a single vibration isolation table unit 2, so as to provide freedom of design of the rack arrangement within the container-type data center.

Figure 4:
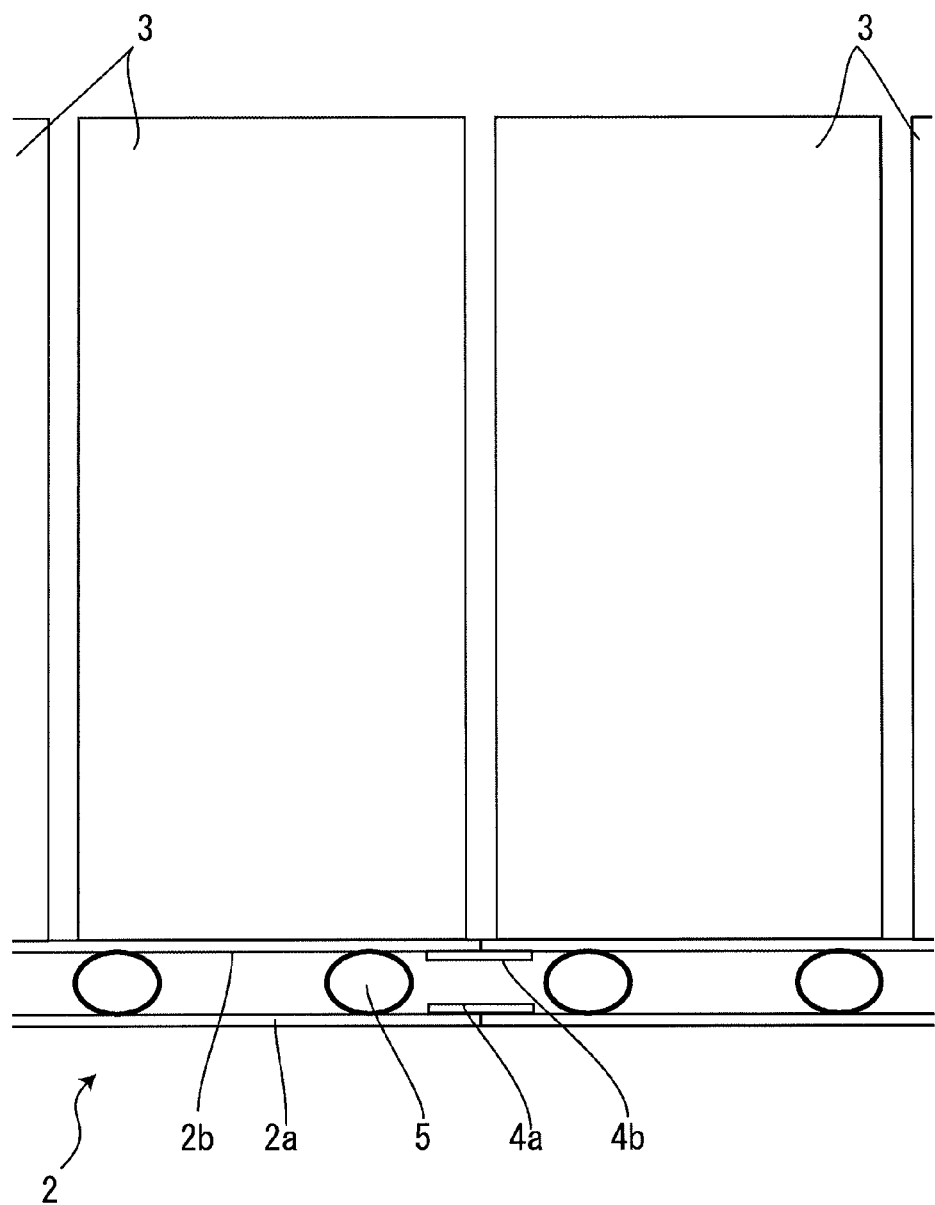
FIG. 4 is a side view showing a vibration isolation configuration of a vibration isolation table unit in a state where racks are mounted on vibration isolation units according to a different embodiment of the container-type data center of the present invention.

FIG. 4 is a side view illustrating the detailed configuration of a vibration isolation table 2 unit having racks 3 placed thereon. The vibration isolation table unit 2 is composed of a lower plate 2a and an upper plate 2b, with multiple spring vibration isolators 5 arranged between the upper and lower plates 2a and 2b. The spring vibration isolator 5 is required to provide a vibration isolation effect (of 1 G or smaller) with respect to the vibration in the vertical or horizontal direction during transportation. The adjacently-arranged vibration isolation table units 2 of the vibration isolation table units 2 having racks 3 accommodating IT equipment placed thereon have their adjacently arranged respective lower plates 2a mutually connected and fixed via an upper connecting member 4a and respective upper plates 2b mutually connected and fixed via a lower connecting member 4b. By connecting the respective adjacent vibration isolation table units 2, an integrated vibration isolation table as a whole can be formed. Further, the size of the vibration isolation table unit 2 in the width direction should preferably be set somewhat smaller than the size of the floor surface of the container 1 in the width direction, and the units are arranged with a clearance from the inner walls of the container 1. This is to prevent collision/contact/interference of the vibration isolation table units 2 with the inner walls of the container 1 when absorbing the vibration generated in the container 1 by the spring vibration isolators 5. Further according to FIG. 4, racks 3 placed on the vibration isolation table unit 2 are arranged with a small clearance therebetween, which is also for preventing collision/contact/interference with the adjacent racks 3 by vibration.

Figure 5:
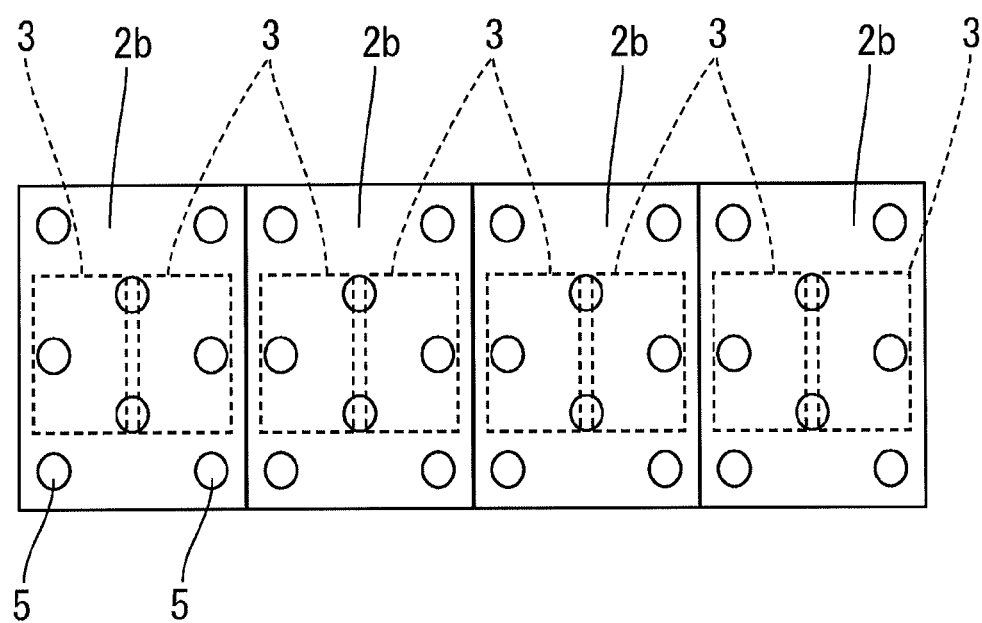
FIG. 5 is a plan view showing an example of arrangement of vibration isolation springs to be attached to vibration isolation table units according to another embodiment of the container-type data center of the present invention.

FIG. 5 is a plan view showing the arrangement of spring vibration isolators 5, 5, 5 . . . when racks 3 are placed on the vibration isolation table unit 2. As shown in FIG. 5, two isolators 5 are arranged at the center at even intervals, and a set of three spring vibration isolators 5 are similarly arranged respectively at even intervals on both sides thereof in the width direction of the vibration isolation table unit 2, so that total of eight isolators are arranged. By arranging the spring vibration isolators 5 evenly as described, it becomes possible to absorb the violation in various directions by the spring vibration isolators 5 and to prevent vibration from being transferred to the upper plate 2b of the vibration isolation table unit 2 and the racks 3 placed thereon, even when vibration in the vertical direction and the horizontal direction occur to the container 1. Thus, by laying vibration isolation table units 2 in the container 1 and placing racks 3 thereon, vibration and other shocks will not be transmitted to the IT equipment, and the IT equipment will not be damaged or failed by the falling or detachment of components, even when the container is transported with the IT equipment arranged therein. Further, by limiting the number of racks loaded on the vibration isolation table unit 2 to two, the vibration isolation table unit 2 can be made compact, and an operation to lay the necessary number of units 2 corresponding to the number of racks to be stored in the container 1 can be adopted to realize cost reduction effects. Further, even when failure of spring vibration isolators 5 or the like occurs, only the failed area can be removed and fixed or replaced with a new component, so that superior maintainability is realized.

FIGS. 1 and 2 have illustrated an embodiment where the racks 3 are arranged at an offset position in the width direction of the vibration isolation table unit 2, but FIG. 5 illustrates an embodiment where the width-direction center position of the racks are arranged to correspond to the center of the vibration isolation table unit 2. These arrangements can be selected either by arranging hot aisles and cold aisles evenly or by forming the capacity of either one greater than the other within the range enabling maintenance and other operations to be performed by operators.

At first, the outline of the preferred embodiment of a container-type data center according to the present invention will be described with reference to FIGS. 1 and 2. In FIG. 1, a visible outline of a container constituting a container-type data center according to the present invention is illustrated by dotted line 1. The container size and upper and lower connecting interfaces are designed in compliance with ISO container standards (ISO Standard 6346). A framework of a container 1 is composed of H steels made of iron, which is covered with a wall surface having a heat insulating material, and formed into a shape of a substantially rectangular parallelepiped. By forming the framework using H steels, it becomes possible to provide sufficient strength for stacking multiple containers 1, and to prevent deformation caused by vibration and the like. Further, a twist-lock mechanism not shown is formed at four corners on the upper and lower portions of the container 1, which has both the function of a positioning guide for stacking multiple containers 1 and the function for preventing displacement of the stacked containers.

The container-type data center of the present invention is a sealed steel container, and doors are made airtight. Internal heating generated from the IT equipment is cooled by an air conditioning unit disposed in the interior thereof; which adopts an air circulation system. Thus, unattended operation is enabled, and high waterproof and dustproof performances can be ensured during operation. However, there is a need to consider ventilation for manual operation within the container.

The external shape of the container can be designed freely according to the number of racks for installing the IT equipment, and the illustrated embodiment is designed equal to a 40-ft container size, with an interface unit for securing the container for transportation on ships and trailers. Thus, there are advantages in that securing is facilitated for transporting the container on ships, and that the container can be transported on a standard trailer for trailer transportation. However, shipment of the container on a ship is a product delivery of a completed product, so that there is a need to consider transportation that will not damage the main body of the container.

According to the container-type data center of the present invention, a vibration isolation table unit having a vibration isolating mechanism is disposed on a bottom portion of the container so as to enable transportation on a trailer with the IT equipment loaded therein. This mechanism enables to significantly reduce the acceleration of vibration in the vertical direction during transportation.

The container-type data center according to the present invention can be designed to enable outdoor units for the air conditioner of the container to be disposed on the same floor as the container on the outer side of the container having IT equipment arranged therein, for facilitating movement. Thereby, the refrigerant piping can be fixed, and there is no need to reinstall the outdoor units and lay the refrigerant piping every time the container is moved. Four air-cooled units are installed as the air conditioning facility, one of which is a spare.

According to the container-type data center of the present invention, a mechanism for sliding the IT equipment racks toward front and rear directions can be disposed on the bottom portion of the racks for ensuring maintenance space.

According to the embodiment illustrated in FIG. 1 of the container-type data center of the present invention, the dotted line 1 shows the external shape of the container having a structure in compliance with ISO Standards. The container 1 is formed by preparing two sets of frames formed in a substantially rectangular shape using H steels made of iron, each of which is formed as an upper side frame or a lower side frame, the four corners of which are connected via pillar sections 14a, 14b, 14c and 14d formed of H steels made of iron, thereby forming the framework having an overall substantially rectangular parallelepiped shape. A plate made of iron is mounted on the upper side frame to constitute a ceiling surface 16, and a plate made of iron is similarly mounted on the lower side frame to constitute a floor surface 17.

By forming the framework using H steels as described, it becomes possible to provide sufficient strength for stacking multiple containers 1 and to prevent the containers 1 from being deformed by vibration and the like. Further, although not illustrated, common twist-lock mechanisms are formed at the four corners of the upper side frame and the lower side frame of the container 1, which have bah the function of a positioning guide for stacking multiple containers 1 and the function for preventing displacement of the stacked containers.

The container 1 is divided by a partition panel 10 into an IT equipment accommodation chamber 18 for accommodating racks 3 storing IT equipment (not shown) and an outdoor unit facility chamber 15 for the air conditioning facility. Pillar sections 14e and 14f formed of H steels similar to pillar sections 14a through 14d are disposed on the width-direction ends of the partition panel 10. An iron door 13 is disposed on a wall surface opposing to the outdoor unit facility chamber 15 of the container 1. Thereby, the area of the IT equipment accommodation Chamber 18 of the container 1 is surrounded by the upper side frame, the lower side frame, pillar sections 14a, 14b and partition pillar sections 14e and 14f, and an enclosed space is formed with the iron plates attached to the ceiling surface 16, the floor surface 17 and side walls 19a and 19b, and the partition panel 10 and the iron doors 13 disposed on the end walls. According to the container-type data center of the present invention, the IT equipment accommodation chamber 18 forms an air-conditioned and enclosed space during operation, but during maintenance and the like, operators must enter and exit the IT equipment accommodation chamber 18, so that entrance/exit doors 11 and 12 are formed arbitrarily on side walls 19a and 19b. The iron door 13 on the wall surface opposed to the outdoor unit facility chamber 15 of the container 1 functions as an entrance opening for carrying in indoor units 7a, 7b, 7c and 7d of the air conditioning facilities, racks 3 and IT equipment to be stored in the racks to the container, and when carrying in of the components is completed, the entrance is closed.

The size of the outdoor unit facility chamber 15 in the length direction is 1.6 to 2 meters, and the detailed size can be set appropriately according to the size of the outdoor units 6a, 6b, 6c and 6d. The outdoor unit facility chamber 15 is opened without any side walls, and the outdoor units 6a, 6b, 6c and 6d can be directly exposed to outer air, so that the heat exchange efficiency can be enhanced. Two of the outdoor units 6a, 6b, 6c and 6d can be disposed along the width direction by having air discharge openings face the outer side of the container, and by stacking the units by assembling angle steel racks, a total of four units can be disposed by arranging the units vertically in upper and lower levels.

A refrigerant piping not shown is passed through the partition panel 10, connecting the outdoor units 6a, 6b, 6c and 6d disposed in the outdoor unit facility chamber 15 and indoor units 7a, 7b, 7c and 7d disposed in the IT equipment accommodation chamber 18. At this time, by adopting a flexible tube as the refrigerant piping (not shown), the refrigerant piping and the partition surface 10 will not be damaged even when vibration or displacement occurs to the outdoor units 6a, 6b, 6c and 6d or the indoor units 7a, 7b, 7c and 7d.

According to the container-type data center arranged as above, outdoor units 6a, 6b, 6c and 6d can be stored within the container without deviating from the ISO container standards, by providing the outdoor unit facility chamber 15 to fit in the external shape of the container. Further, by arranging the four outdoor units 6a, 6b, 6c and 6d so that the air discharge openings face to the outer side in the width direction and arranging a greater number of air conditioning facilities compared to the prior art container-type data center, the cooling performance can be improved. Furthermore, the container can be transported while having the outdoor units 6a, 6b, 6c and 6d disposed therein, so that there is no need to re-install the outdoor units 6a, 6b, 6c and 6d and to construct the air conditioning piping at the transportation destination, and the required time from installation to the operation of the data center can be shortened.

The embodiments of the present invention have been described in detail, but the present invention is not restricted to the above-illustrated embodiments, and various deformations are enabled within the scope of the invention. For example, the number of the outdoor units 21 has been illustrated as four, but the number is not restricted thereto, and can be changed arbitrarily according to the cooling function of the air conditioning facility, for example.

REFERENCE SIGNS LIST

100 Container
6a, 6b, 6c, 6d Outdoor unit
7a, 7b, 7c, 7d Indoor unit
10 Partition panel
11, 12 entrance/exit door
13 Iron door
14a, 14b, 14c, 14d Pillar section
14e, 14f Partition pillar section
16 Ceiling surface
17 Floor surface
19a, 19b Side wall
18 IT equipment accommodation chamber
15 Outdoor unit facility chamber

The invention claimed is:

1. A container-type data center having an external shape corresponding to a size of a container for transportation, equipped with an air conditioning facility and loading multiple racks accommodating IT equipment in an interior thereof:

wherein the container has a framework composed of an upper frame and a lower frame having a substantially rectangular shape, and pillar sections connecting the four corners of the upper and lower frames, the upper frame having a ceiling surface formed of iron and the lower frame having a floor surface formed of iron disposed thereto;

the container further comprises one pair of pillar sections for partition disposed between two respective pillar sections opposing to each other in the longitudinal direction out of the four pillar sections, a partition panel in the width direction mounted between the pillar sections for partition;

in one side of the container separated by the partition panel is formed an IT equipment accommodation chamber for accommodating components such as IT equipment by disposing side walls and an iron door to form a sealed space; and in the other side of the container is formed an outdoor unit installation chamber for arranging outdoor air conditioning units, the outdoor unit installation chamber having a ceiling surface and a floor surface integrated with respective ceiling surface and floor surface of the IT equipment accommodation chamber, while the outdoor unit chamber is opened by not providing a side wall.

2. The container-type data center according to claim 1, wherein an outer dimension of the container is in compliance with ISO standards, and the partition panel is disposed within a range of 1.6 to 2 meters from an end portion having the outdoor unit installation chamber of the container.

3. The container-type data center according to claim 1, wherein one or two outdoor units for air conditioning are arranged so that an air discharge opening is faced toward a width direction of the container.

4. The container-type data center according to claim 3, wherein an angle steel rack is provided in the outdoor unit installation chamber, and the outdoor units for air conditioning are stacked vertically in upper and lower levels.

* * * * *